United States Patent

Shinma

(10) Patent No.: US 7,622,067 B2
(45) Date of Patent: Nov. 24, 2009

(54) APPARATUS AND METHOD FOR MANUFACTURING A SEMICONDUCTOR DEVICE

(75) Inventor: Yasuhiro Shinma, Kawasaki (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/441,760

(22) Filed: May 26, 2006

(65) Prior Publication Data

US 2006/0279021 A1 Dec. 14, 2006

Related U.S. Application Data

(63) Continuation of application No. PCT/JP2005/009880, filed on May 30, 2005.

(51) Int. Cl.
*H01L 21/56* (2006.01)
*B29C 45/14* (2006.01)

(52) U.S. Cl. ............... 264/272.17; 425/116; 425/127

(58) Field of Classification Search ............ 425/89, 425/116, 127; 264/272.17
See application file for complete search history.

(56) References Cited

U.S. PATENT DOCUMENTS

| 4,954,308 | A | | 9/1990 | Yabe et al. | |
|---|---|---|---|---|---|
| 5,316,463 | A | * | 5/1994 | Neu | ............... 425/116 |
| 5,429,488 | A | * | 7/1995 | Neu | ............... 425/116 |
| 2003/0100142 | A1 | * | 5/2003 | Shin et al. | ............... 438/110 |
| 2004/0105909 | A1 | * | 6/2004 | Tofukuji et al. | ............... 425/116 |
| 2005/0263871 | A1 | * | 12/2005 | Shinma et al. | ............... 257/690 |

FOREIGN PATENT DOCUMENTS

| GB | 2217646 | | 11/1989 |
|---|---|---|---|
| JP | 61046049 | B * | 10/1986 |
| JP | 01234217 | | 9/1989 |
| JP | 01234217 | A * | 9/1989 |
| JP | 04196330 | | 7/1992 |
| JP | 05016184 | | 1/1993 |
| JP | 05243419 | A * | 9/1993 |
| JP | 06302634 | A * | 10/1994 |
| JP | 07308943 | | 11/1995 |
| JP | 09036155 | | 2/1997 |
| JP | 09300366 | | 11/1997 |
| JP | 2001250837 | | 9/2001 |
| JP | 2004098364 | | 4/2004 |
| JP | 2004153045 | | 5/2004 |
| JP | 2004193582 | | 7/2004 |
| JP | 2004193582 | A * | 7/2004 |

* cited by examiner

*Primary Examiner*—Robert B Davis

(57) ABSTRACT

An apparatus for manufacturing a semiconductor device includes an upper mold (21), a lower mold (22), and a plate (30, 130, 230) that includes at least one cavity (31) that receives resin and defines an outer shape and a thickness of a resin sealing portion, and a gate (32) through which the resin is guided to the cavity (31), the plate (30) being interposed between the upper mold (21) and the lower mold (22). The plate (130) further includes a resin film (132) fixed by viscoelastic or adhesive bonding to a side of thin plates (131) towards a substrate on which electrodes are provided. The semiconductor device is provided which has no resin burrs that occur on a substrate in an end portion of the molded body. The plate (30, 130, 230) is formed by multiple thin plates (231, 232, 233) joined by welding or positioned by positioning pins (237, 238).

17 Claims, 11 Drawing Sheets

SEAL RESIN

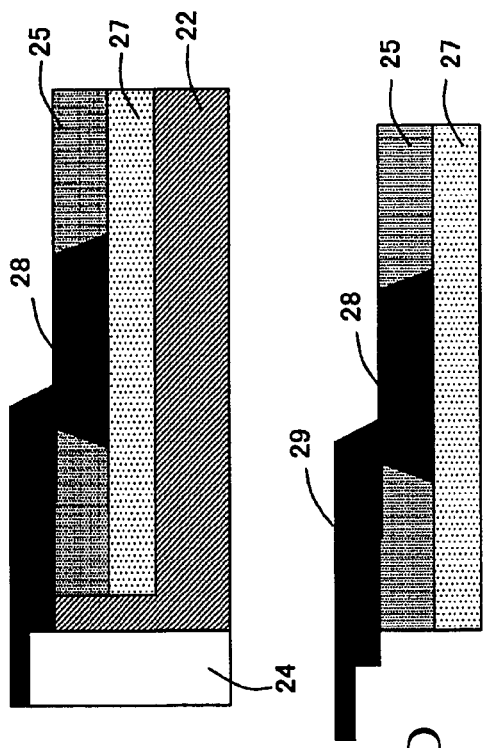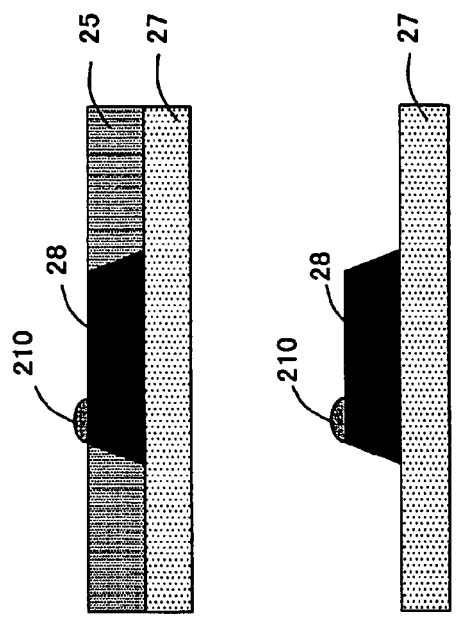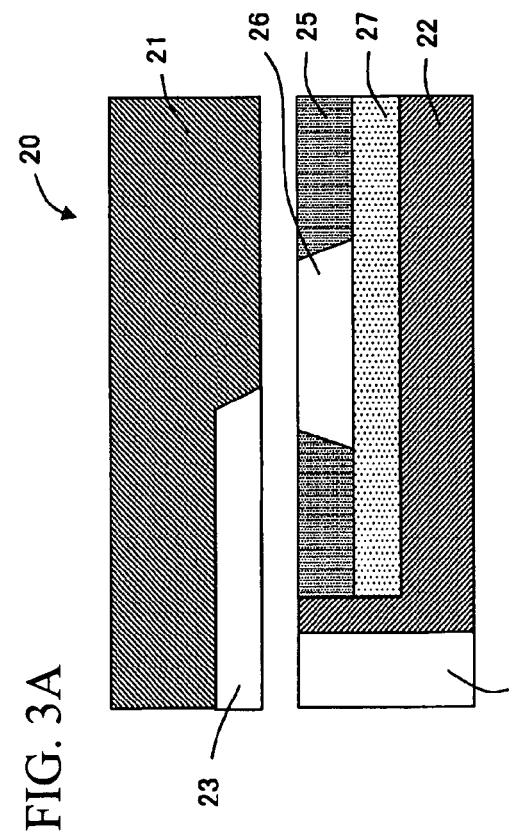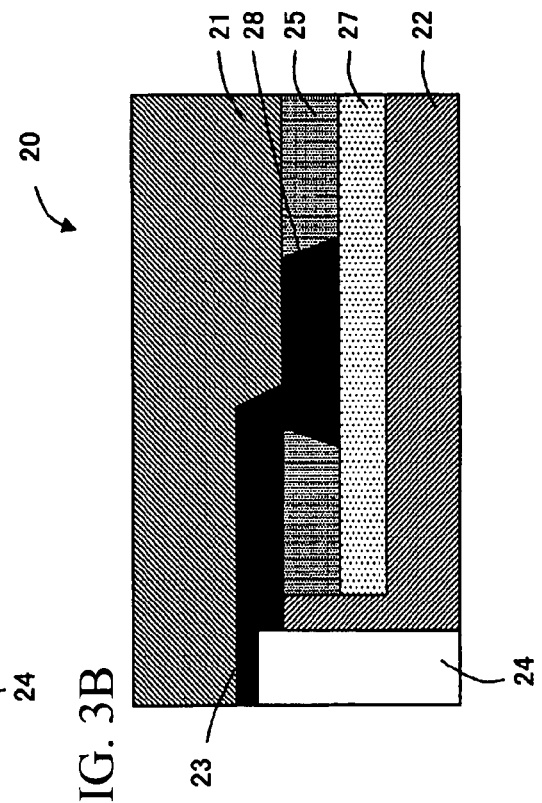
FIG. 3A  FIG. 3B  FIG. 3C  FIG. 3D  FIG. 3E  FIG. 3F

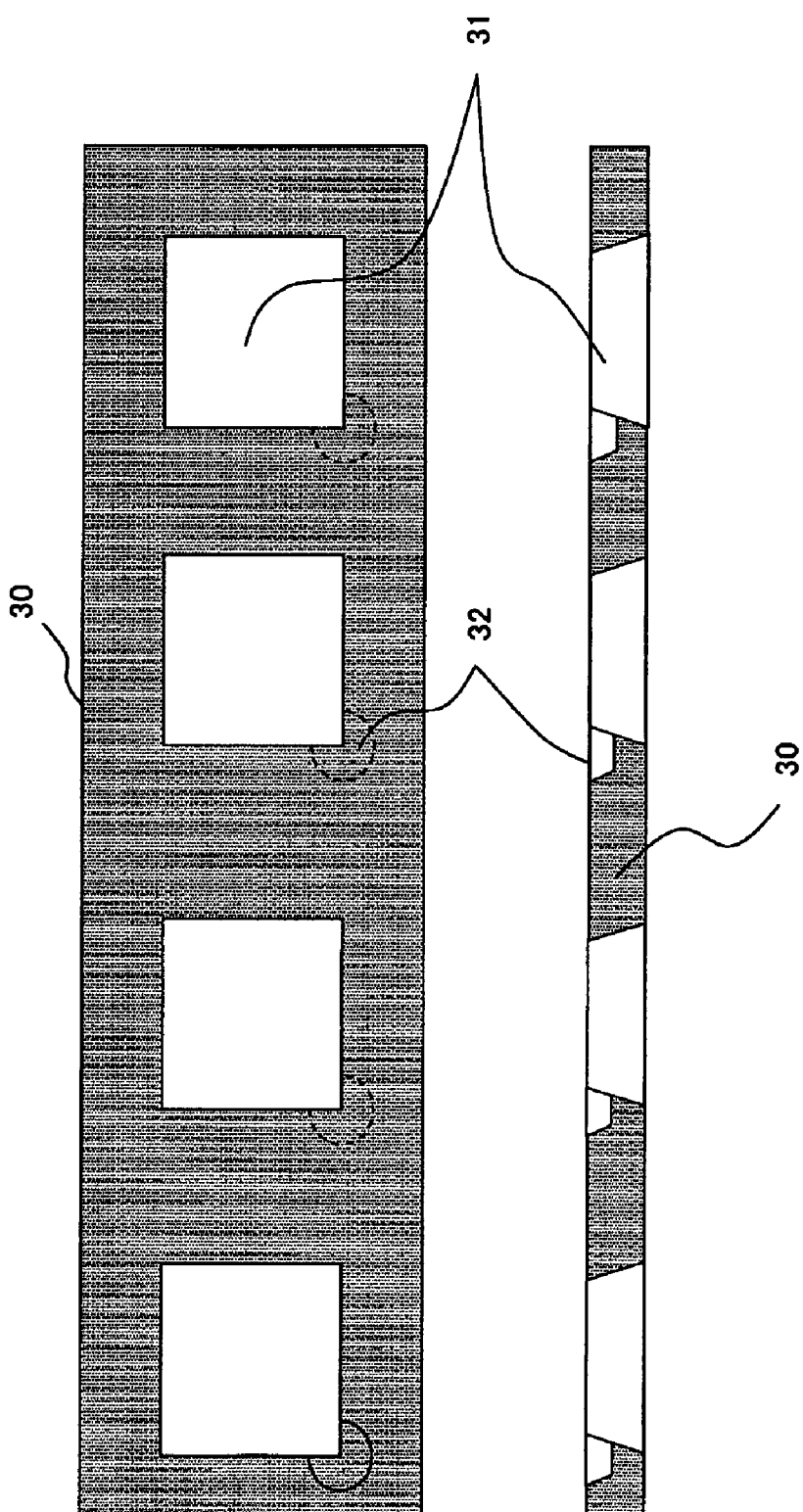

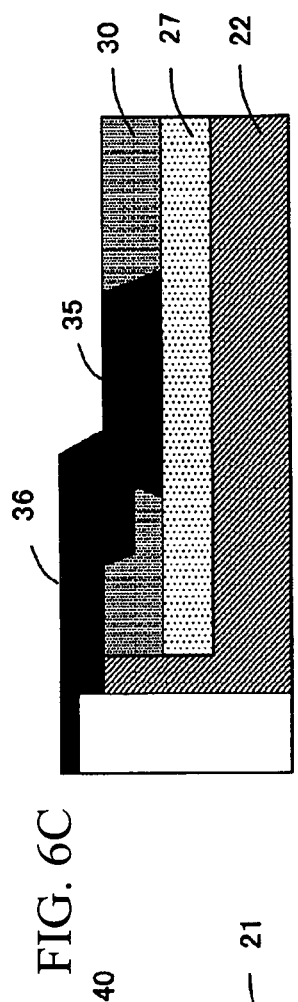
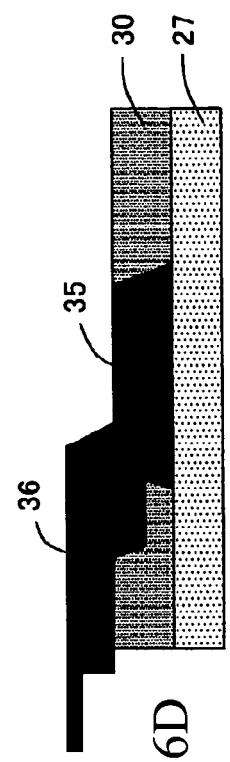
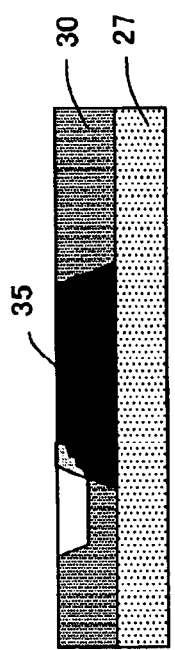
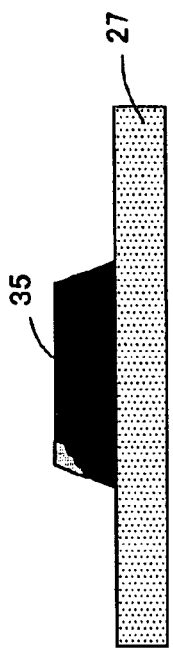
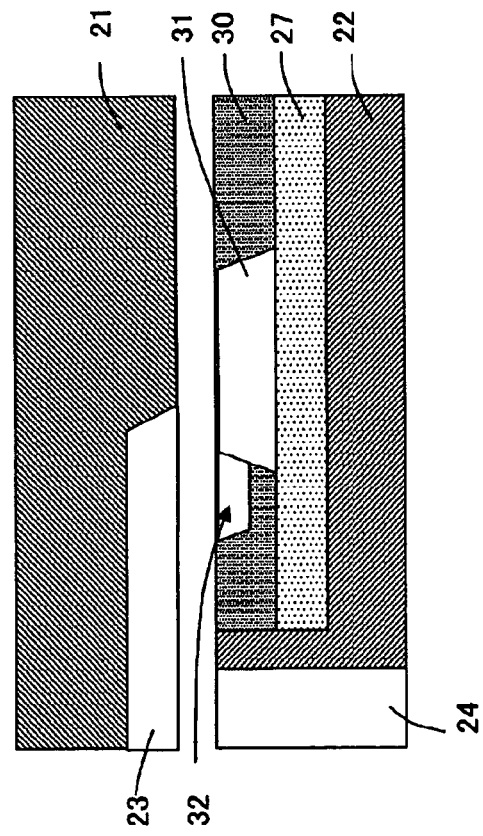
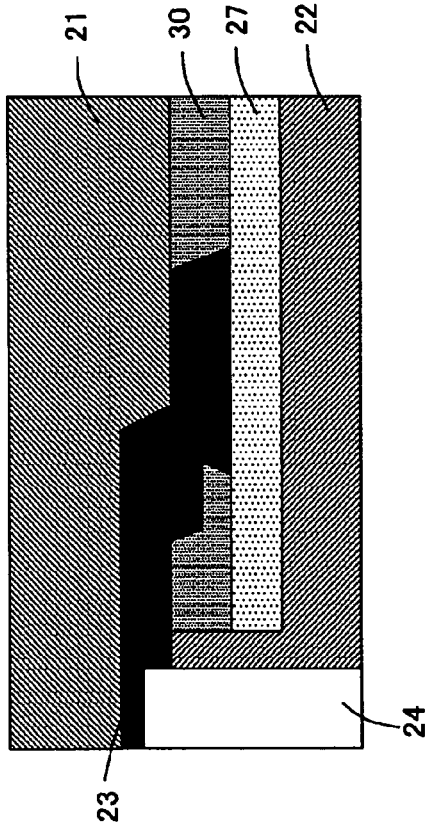
FIG. 6A  FIG. 6C
FIG. 6B  FIG. 6D
FIG. 6E
FIG. 6F

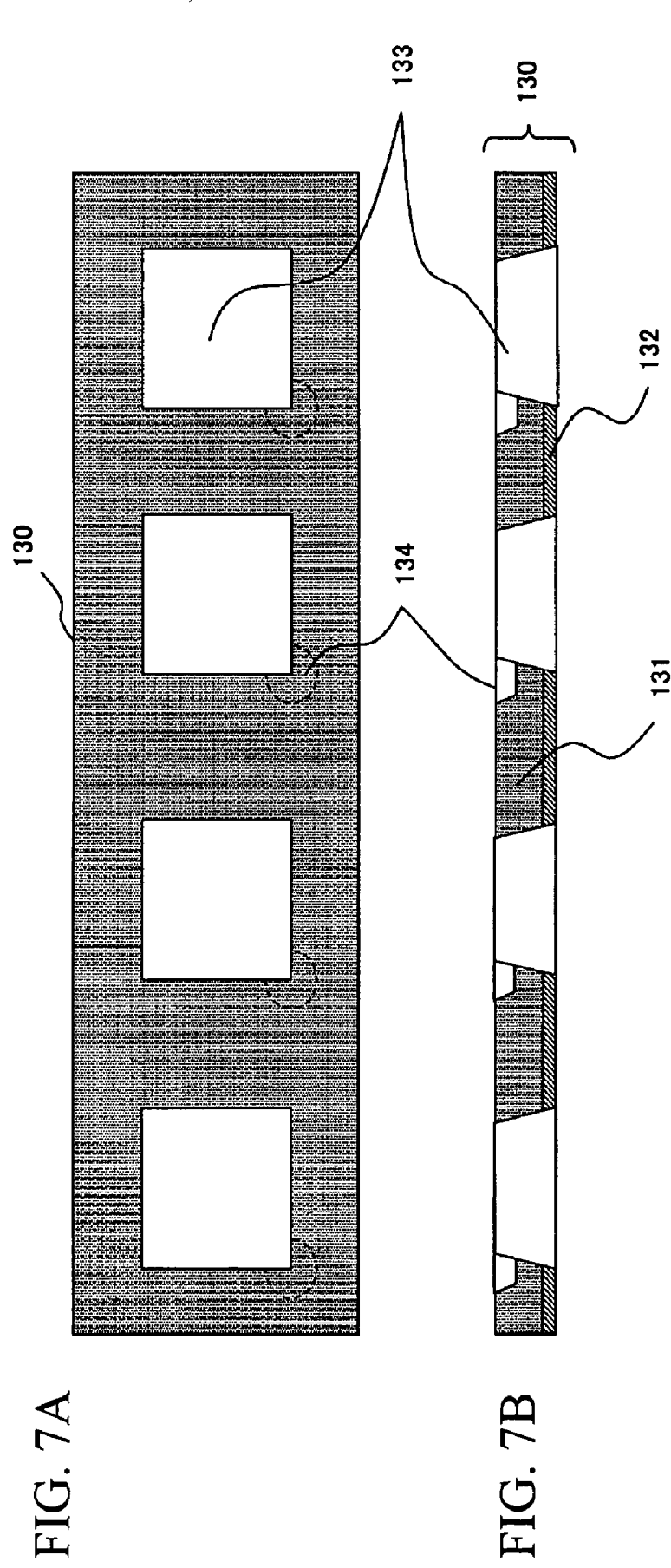

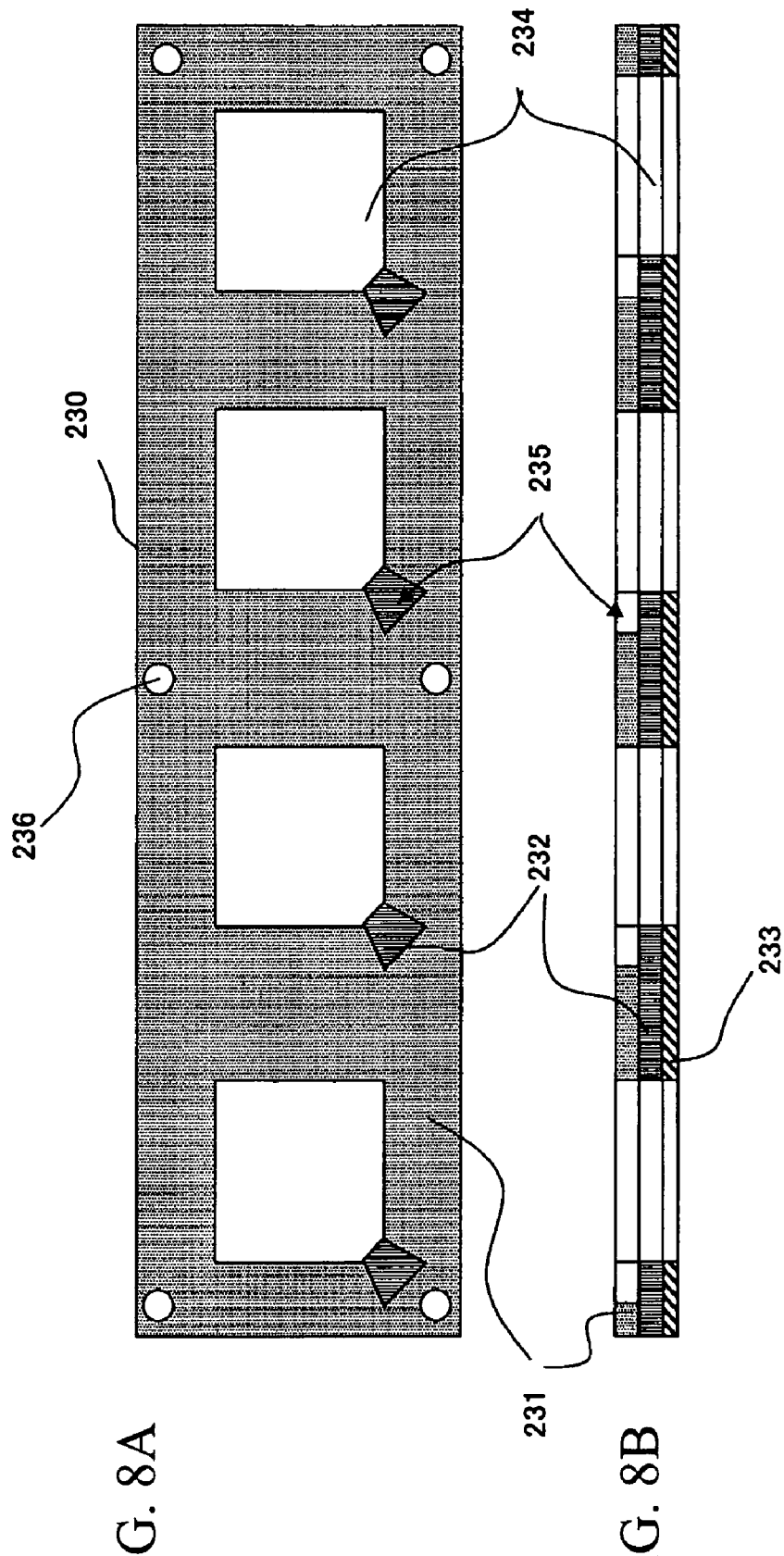

FIG. 11A
FIG. 11C
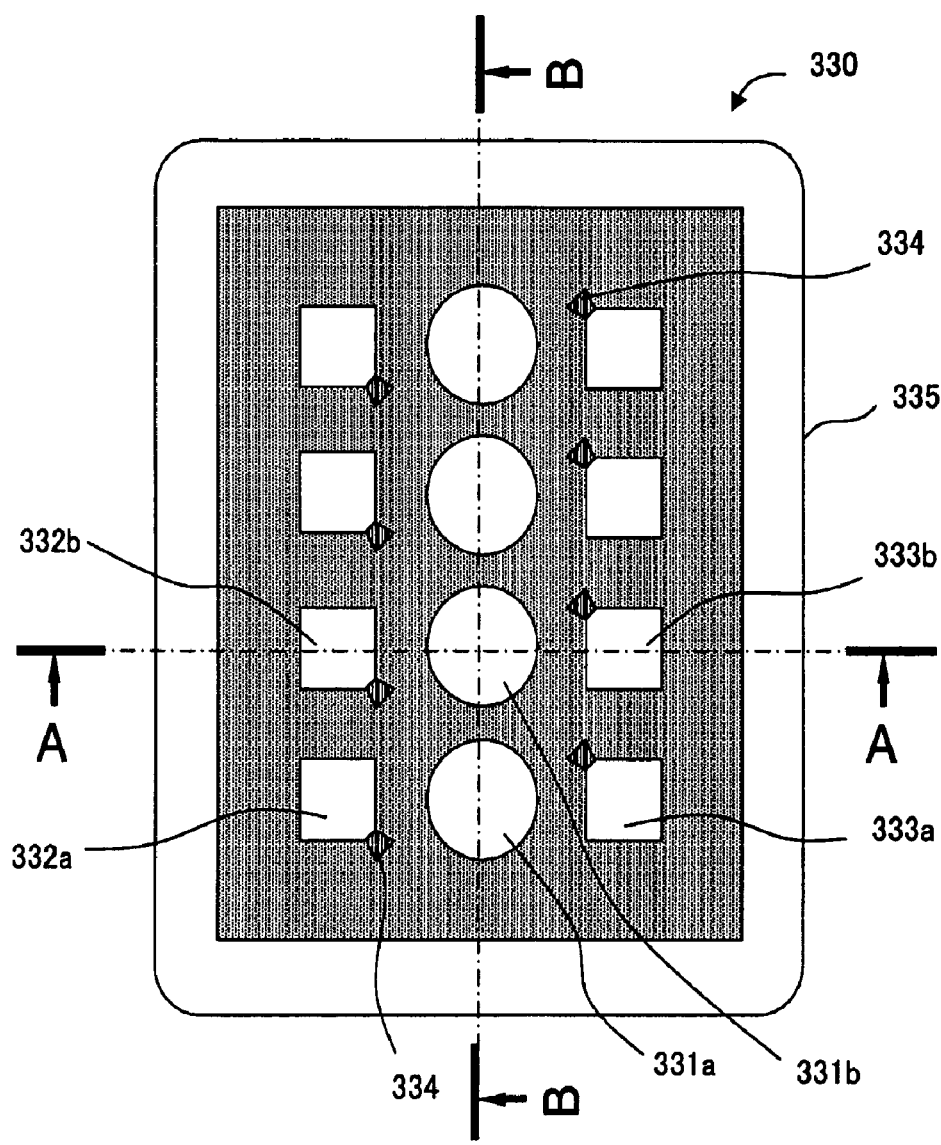
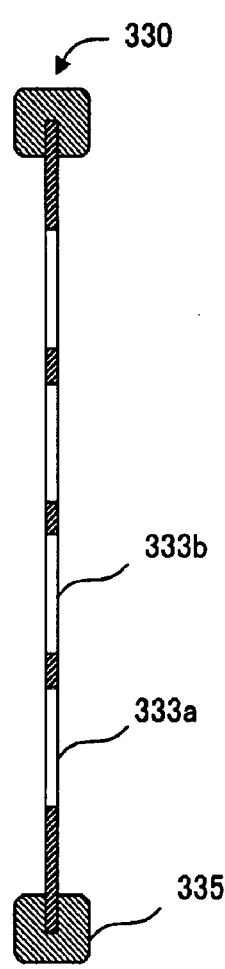
FIG. 11B
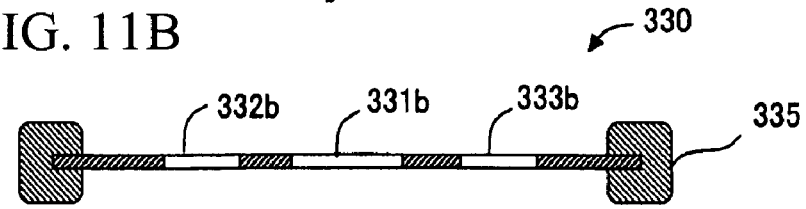

APPARATUS AND METHOD FOR MANUFACTURING A SEMICONDUCTOR DEVICE

CROSS-REFERENCE TO RELATED APPLICATIONS

This is a continuation of International Application No. PCT/JP2005/009880 filed May 30, 2005 which was not published in English under PCT Article 21(2).

BACKGROUND OF THE INVENTION

1. Field of the Invention

The present invention relates to an apparatus and a method for manufacturing semiconductor devices.

2. Description of the Related Art

A conventional transfer molding method injects seal resin between upper and lower molds in which a semiconductor device is placed and a substrate thereof is clamped. A gate for resin injection is provided on a surface of the semiconductor device on which electrodes for interconnections are provided. This arrangement of the gate, however, requires a large substrate size.

FIGS. 1A and 1B relate to a semiconductor device with two Ball Grid Array (BGA) type packages and illustrate the lower one 1 of the two packages. The lower package has an interposer 2, electrode pads 3, a gate 4 for injecting resin and a resin sealing portion 5. The electrode pads 3 are used to make connections with external electrodes of the upper package. FIGS. 2A and 2B show another conventional package 11. The package 11 has an interposer 12, electrode pads 13, a gate 14 for resin injection, and a resin sealing portion 15. As to the package 1, a semiconductor device has an area that is located in a corner and corresponds to the gate 4, the area being plated with gold which has a poor adhesiveness to the seal resin. This gold plating is intended to allow easy removal of the gate 4 after seal resin molding. The area plated with gold does not allow electrode pads 3 for making electrical connections to be arranged therein and needs a large portion of the substrate for the gold-plated area. This prevents miniaturization of the semiconductor device.

A proposal directed to eliminating the above problems has been proposed in which a gate is provided on an upper surface of the seal resin. This proposal does not use the upper and lower molds but employs three molds, namely, an upper mold, an intermediate mold and a lower mold. The intermediate mold has a cavity for a molded body and a gate for resin injection. However, the structure of the proposed molds makes it difficult to remove the gate and runner resin that remain after molding. Particularly, there is a need to clean the inner wall of the gate each time molding is performed because the injection port is small.

In order to solve the above problem, a plate mold method as shown in FIGS. 3A through 3F has been proposed (Japanese Patent Application Publication No. 2004-193582, hereinafter referred to as Document 1). An apparatus 20 for manufacturing a semiconductor device has an upper mold 21, a lower mold 22, and a plate 25 in which a cavity 26 is formed. A substrate 27 on which a semiconductor chip (not shown) is mounded is placed in a substrate holding portion defined in an open state of the upper mold 21 and the lower mold 22. Next, the plate 25 is disposed between the upper mold 21 and the lower mold 22. Melted resin is supplied via a supply port 24 formed on the lower mold 22. The melted resin supplied via the supply port 24 is injected into the cavity 26 via a runner 23. The state in which the cavity 26 is filled with the resin is held for a few minutes in order to cure the resin. A sealing portion 28 is formed into the same shape as that of the cavity 26. Thereafter, the lower mold 22 is moved down to separate the molded body and the upper mold 21 from each other. Unnecessary resin 29 is removed and the plate 25 is taken away, so that the device with the semiconductor chip sealed with resin can be completed.

However, the conventional art disclosed in Document 1 has a disadvantage in that a gate residual 210 frequently results. When there is the gate residual 210, or resin burr, after removal of the unnecessary resin 29, the semiconductor device is thickened. Alternatively, if the gate is undercut, the semiconductor device may have an exposed portion.

SUMMARY OF THE INVENTION

The present invention has been made in view of the above circumstances and provides an apparatus and method for manufacturing a semiconductor device having no resin burrs on an upper surface of a molded body.

An apparatus for manufacturing a semiconductor device includes an upper mold, a lower mold, and a plate that includes a cavity for receiving resin and defining an outer shape and a thickness of a resin sealing portion and a gate through which the resin is guided to the cavity to which the gate is connected, the plate being interposed between the upper mold and the lower mold. The present invention employs the cavity for forming the shaped device by injecting resin into the plate and curing the resin and employs the gate for guiding the resin to the cavity and, thus, is capable of providing a semiconductor device without resin burrs on a substrate in an end portion of the molded device. Even if a gate residual exists, it can be prevented from protruding from the upper surface of the molded body. Thus, the device after gate break will have uniform height. Further, the semiconductor device does not have any exposed portion after the gate is undercut.

The cavity may have an opening area that varies in the thickness direction of the plate. The gate may also have an opening area that varies in the thickness direction of the plate and may be provided at a position wherein the resin is supplied from the side of the cavity. The plate may further include a resin film provided on a side thereof that contacts a substrate of the semiconductor device. Thus, the resin film absorbs a roughness due to the presence of interconnection lines on the substrate and prevents resin from being leaked to electrodes provided on the substrate.

The plate may additionally include a resin film, provided on a side thereof, which contacts a substrate of the semiconductor device and is fixed thereto by viscoelastic or adhesive bonding. The plate may also include a resin film provided on a side thereof that contacts a substrate of the semiconductor device, the plate and the resin film having a through hole into which a given pin is inserted.

The plate may include multiple laminated thin plates. The plate may also include multiple thin plates that are laminated and bonded by welding. If the plate is formed by scraping metal, the plate will not have uniform thickness and will likely be warped. The use of a defective plate may cause a mismatch of the outer size with the specification or a joint failure and may decrease the production yield. In contrast, thin plates may be formed by metal rolling wherein their formation is very precisely regulated to provide a given thickness. Thin plates thus formed are laminated to form the plate having a uniform thickness and distributing stress to the thin plates, so that warping of the plate can be restricted and production yield of the semiconductor devices can be improved.

The plate may include multiple thin plates that are laminated with the gate provided in an uppermost one of the multiple thin plates. The plate may also include multiple thin plates that are laminated and may have through holes that are provided in corresponding positions, a pin, such as a positioning pin, being inserted into the through holes. Thus, the plate may be fixed to the upper and lower molds by the positioning pin. In addition, the plate may have cavities and a supply port via which the resin is supplied, and the cavities may be symmetrically positioned so as to interpose the supply port between the cavities. Also, the plate may have a portion that contacts the resin, such portion being coated with fluorocarbon resin or being plated with gold to improve the detachability of the plate. The plate may further include a frame provided along an outer circumference of the plate and having rigidity, so that the plate can be prevented from being deformed even when the plate is thin.

According to another aspect of the present invention, there is provided a method of fabricating a semiconductor device which includes the steps of placing a plate between an upper mold and a lower mold, the plate having a cavity and a substrate of the semiconductor device being provided on the plate and supplying resin to the cavity from a supply port provided in the lower mold via a gate connected to the cavity and provided in the plate. The present invention employs the cavity for forming the shaped device by injecting resin into the plate and curing the resin, and employs the gate for guiding the resin to the cavity, thereby reliably providing a semiconductor device unlikely to have resin burrs on a substrate in an end portion of the molded device. Even if a gate residual exists, it can be prevented from protruding from the upper surface of the molded body. Thus, the device after gate break will have uniform height. Further, the semiconductor device does not have any exposed portion after the gate is undercut.

The cavity may have an opening area that varies in a thickness direction. Additionally, the gate may have an opening area that varies in a thickness direction and may be provided at a position in which the resin is supplied from a side of the cavity. The plate may include multiple thin plates that are laminated and, thus, it is possible to prevent the plate from being warped.

BRIEF DESCRIPTION OF THE DRAWINGS

FIGS. 3A through 3F show a conventional plate molding process;

FIG. 5A is a plan view of a plate used in accordance with the first embodiment first embodiment of the present invention, and FIG. 5B is a cross-sectional view of the plate of FIG. 5A;

FIGS. 6A through 6F show a resin sealing process for the semiconductor device in accordance with the first embodiment of the present invention;

FIG. 7A is a plan view of a plate in accordance with a second embodiment of the present invention, and FIG. 7B is a cross-sectional view of the plate of FIG. 7A;

FIG. 8A is a plan view of a plate in accordance with a third embodiment of the present invention, and FIG. 8B is a cross-sectional view of the plate of FIG. 8A;

FIG. 11A is a plan view of a plate in accordance with a fourth embodiment of the present invention, FIG. 11B is a cross-sectional view of the plate of FIG. 11A taken along a line A-A shown in FIG. 11A, and FIG. 11C is a cross-sectional view of the plate of FIG. 11($a$) taken along a line B-B shown in FIG. 11A.

DESCRIPTION OF THE PREFERRED EMBODIMENTS

A description will now be given of embodiments of the present invention with reference to the accompanying drawings.

First Embodiment

Figure 1A:
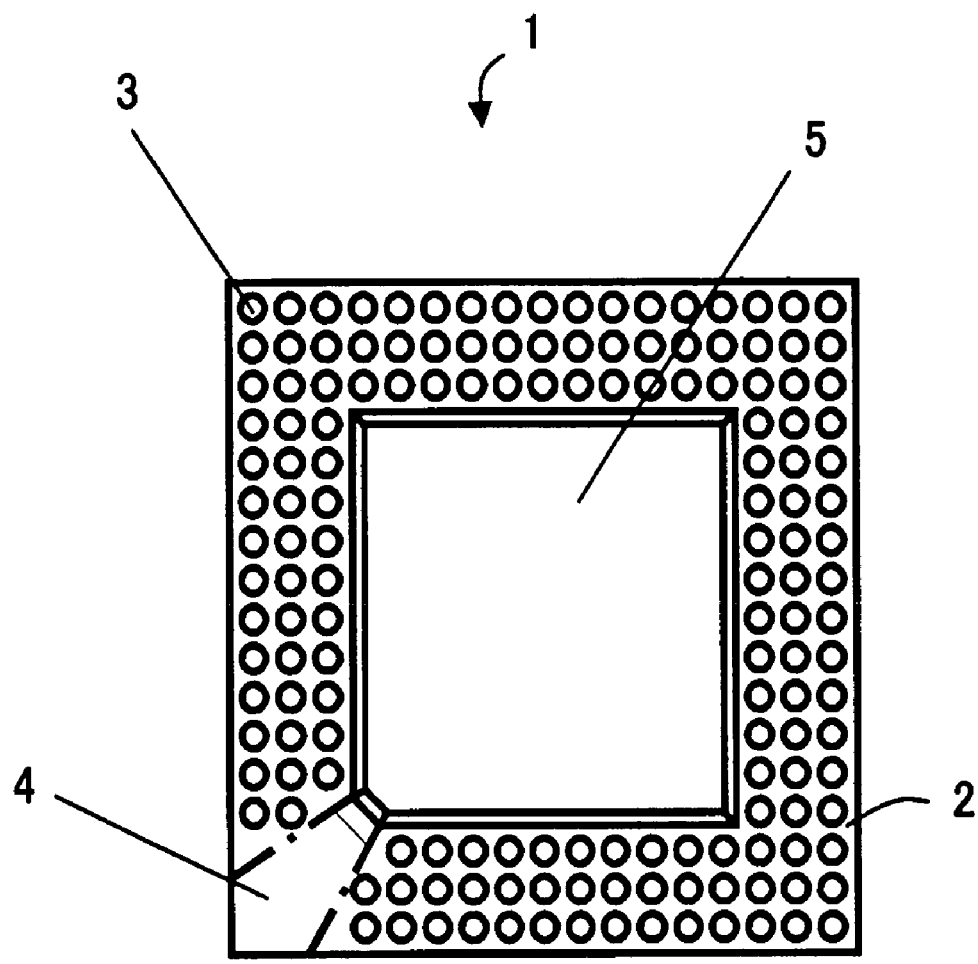
FIGS. 1A and 1B show a first conventional package.
Figure 1B:
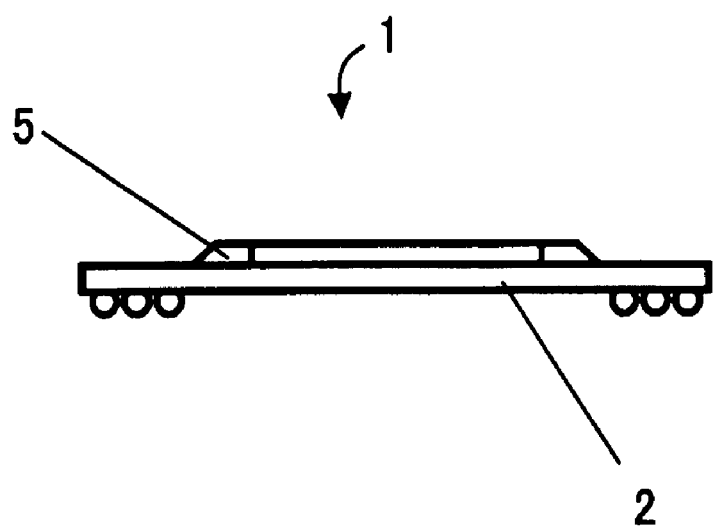
Figure 2A:
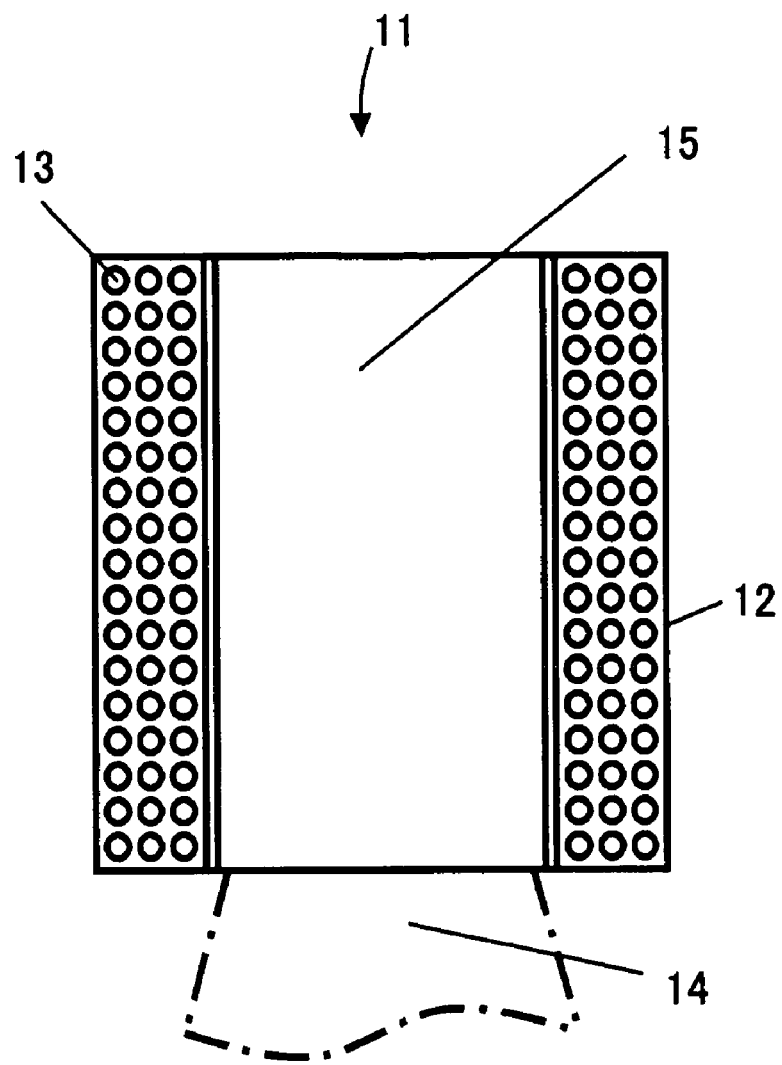
FIGS. 2A and 2B show a second conventional package.
Figure 2B:
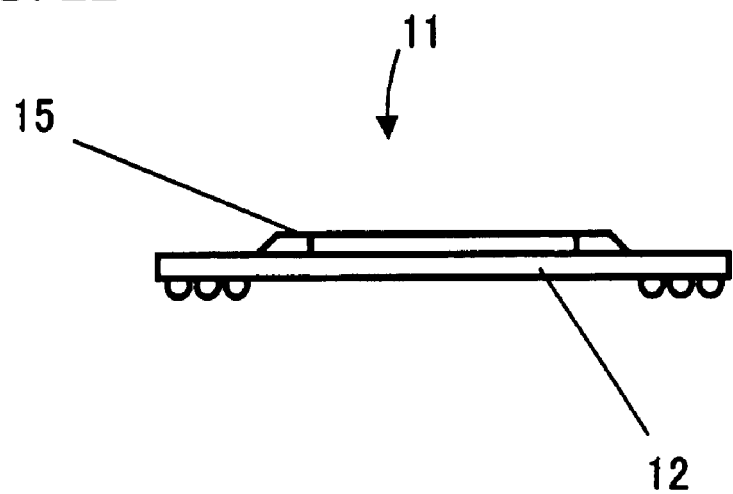
Figure 4A:
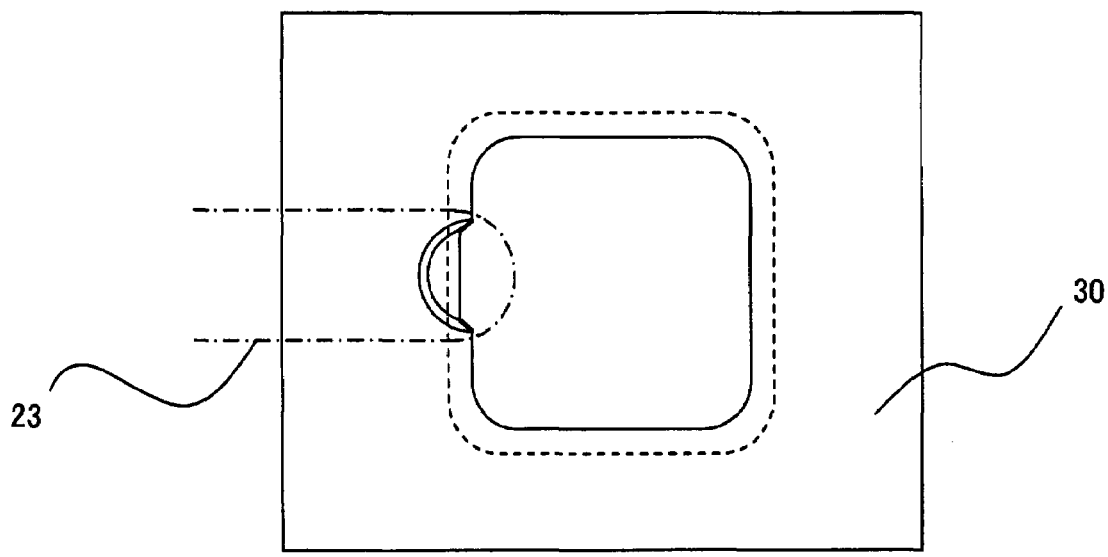
FIG. 4A is an enlarged view of a cavity of a carrier of an apparatus for manufacturing a semiconductor device in accordance with a first embodiment of the present invention.
Figure 4B:
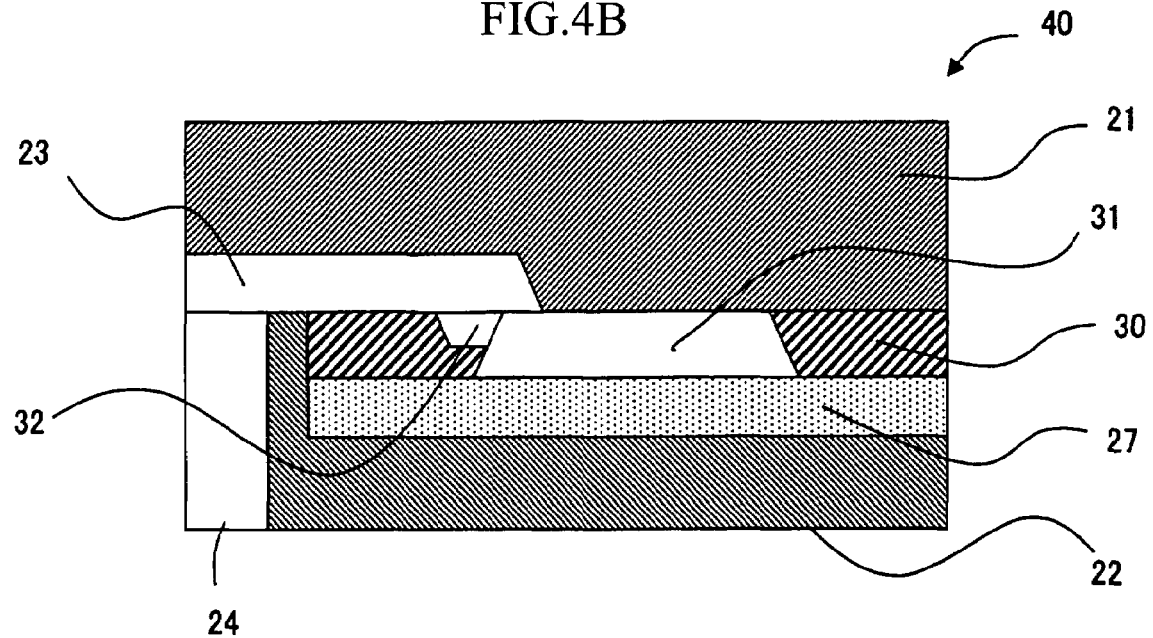
FIG. 4B is a cross-sectional view of a part of the manufacturing apparatus in accordance with the first embodiment of the present invention.

FIG. 4A is an enlarged view of a cavity portion of a carrier used in an apparatus for manufacturing a semiconductor device in accordance with a first embodiment of the present invention, and FIG. 4B is a cross-sectional view of a part of the apparatus in accordance with a first embodiment of the present invention. FIG. 5A is a plan view of a plate used in the first embodiment of the present invention, and FIG. 5B is a cross-sectional view of the plate. An apparatus for manufacturing a semiconductor device includes the upper mold 21, the lower mold 22 and a plate 30. The upper mold 21 has a runner 23, and the upper mold 21 and the lower mold 22 do not have cavities. The apparatus 40 is equipped with a press mechanism (not shown) that clamps and opens the molds 21 and 22. The semiconductor device has electrode pads on a surface of the substrate 27 sealed with resin.

The plate 30 is inserted into the upper mold 21 and the lower mold 22, and includes a cavity 31 that define the outer shape and thickness of the resin sealing portions and a gate 32 for guiding resin to the cavity 31. The plate 30 may be made of, for example, stainless steel, titanium or nickel alloy. The cavity 31 is formed to have an opening area that becomes greater (varies) towards the substrate 27 in the thickness direction of the plate 30.

The gate 32 has a dent (pocket) in the thickness direction of the plate 30. The dent forms an opening area that becomes narrower (varies) towards the substrate 27 in the thickness direction of the plate 30. The gate 32 is provided in a position that allows resin to be injected from a side of the cavity 31. At the time of gate break, the gate 32 causes cracks to originate from a line defined by crossing of the pockets and the side surfaces of the mold. This reduces the probability of a gate residual that protrudes from the upper surface of the molded body.

Referring to FIGS. 5A and 5B, the manufacturing apparatus includes a plate 30 having multiple cavities 31 with multiple gates 32. The upper mold 21 of such apparatus would necessarily have multiple runners 23 formed therein to provide the resin to the cavities 31 and the gates 32.

FIGS. 6A through 6F illustrate a method for a resin sealing process for a semiconductor device in accordance with the first embodiment of the present invention. Referring to FIG. 6A, the substrate 27 on which the semiconductor chip is mounted is placed in the substrate holding portion while the upper mold 21 and the lower mold 22 are separated. The plate 30 is disposed between the upper mold 21 and lower mold 22 over the substrate 27. Referring to FIG. 6B, melted resin is supplied via the supply port 24 formed on the lower mold 22, passes through the runner 23 and the gate 32 formed on the plate 30, and is then injected into the cavity 3 1. The resin injected into the cavity 31 is held for a few minutes in order to cure the resin. Referring to FIG. 6C, the resin sealing portion 35 is formed into the same shape as that of the cavity 31. Then, as shown in FIG. 6D, the lower mold 22 is moved down and the upper mold 21 is detached from the molded body. As shown in FIG. 6E, unnecessary resin 36 is removed and the plate 30 is taken away. In this manner, the semiconductor device with the semiconductor chip being sealed with resin in accordance with the first embodiment of the present invention is obtained, as shown in FIG. 6F.

To manufacture another semiconductor device with a resin sealing portion having a different outer size, the manufacturer need only replace the plate with another plate while the same upper mold 21 lower mold 22 are used. The above-mentioned process with another plate results in a semiconductor device with the resin sealing portion having a different outer size. Thus, conventional mold equipment having the upper mold 21 and lower mold 22 can be utilized for implementation of the present invention.

According to the first embodiment of the present invention, the plate 30 is provided with cavities 31 in which resin is injected and cured for shaping into the molded bodies and gates 32 for guiding the resin to the cavities 31. It is thus possible to provide semiconductor devices that do not have any mold burrs (resin burrs) remaining on the upper surfaces of the molded bodies. Even if a gate residual exists, it is unlikely to protrude from the upper surface of the molded body, thereby providing semiconductor devices which, after gate break, will have a uniform height. Further, the semiconductor device does not have any exposed portion even after the gate is undercut. Additionally, the plate can be reused, thereby reducing the production cost. Additionally, the molds of the present invention are simpler than conventional molds and can be reused for semiconductor devices having different sizes by only providing a different plate 30.

Second Embodiment

A second embodiment of the present invention will now be described with reference to FIGS. 7A and 7B. FIG. 7A is a plan view of a plate in accordance with the second embodiment, and FIG. 7B is a cross-sectional view thereof. A plate 130 is inserted between the upper mold 21 and the lower mold 22, and includes a resin film 132 positioned so as to contact a plate body 131 and electrodes provided on the substrate. The use of the soft resin film 132 absorbs a roughness due to the presence of interconnection lines on the substrate and, by adapting to the uneven surface of the electrodes on the substrate, prevents resin from being leaked thereto. The plate body 131 and the resin film 132 form cavities 133 that define the outer shape and thickness of the resin sealing portion. The cavities 133 are formed so as to have an opening area that becomes greater (varies) towards the substrate (not shown) in the thickness of the plate body 131.

Further, the plate body 131 is provided with gates 134 for guiding resin into the cavities 133. The gates 134 have dents in the thickness direction of the plate body 131 so as to have an opening area that becomes narrower (varies) in the thickness direction thereof. The gates 134 are provided at positions that allow resin to be injected from sides of the cavities 133.

The resin film 132 is fixed, by viscoelastic or adhesive bonding, to a side of the plate body 131 that contacts electrodes on the substrate. If the resin film 132 is not fixed to the plate body 131 by viscoelastic or adhesive bonding beforehand, positioning pins may be used. Positioning pins penetrate through holes formed in the resin film 132 and the plate body 131, which are laminated and positioned in relation to the upper mold 21 and the lower mold 22 for receiving the positioning pins.

Third Embodiment

A third embodiment of the present invention will now be described with reference to FIGS. 8A, 8B and 9. FIG. 8A is a plan view of a plate 230 in accordance with the third embodiment, and FIG. 8B is a cross-sectional view thereof. The plate 230 is inserted between the upper mold 21 and the lower mold 22. Multiple thin plates, which include an uppermost plate 231 and an intermediate plate 232, are laminated and locally joined by spot welding to prevent the plate 230 from warping.

Further, a resin film 233 is attached to the surface of the intermediate plate 232 that contacts the electrodes on the substrate. Cavities 234 for defining the outer shape and thickness of the resin sealing portions are provided in all of the multiple thin plates, e.g., the uppermost plate 231, the intermediate plate 232 and the resin film 233. Gates 235 for guiding resin to the cavities 234 are provided in only the uppermost plate 231 among the multiple thin plates and at positions that allow resin to be injected from the sides of the cavities 234. The resin film 233 is fixed, by viscoelastic or adhesive bonding, to the side of the intermediate plate 232 towards the electrodes on the substrate.

Instead of fixing the resin film 233 to the intermediate plate 232 by viscoelastic or adhesive bonding beforehand, positioning pins may be used. The positioning pins penetrate through guide holes 236 formed in the uppermost plate 231, the intermediate plate 232 and the resin film 233, the guide holes 236 being laminated and positioned on the plate 230 to allow penetration thereof by the positioning pins on either or both of the upper mold 21 and the lower mold 22.

Figure 9:
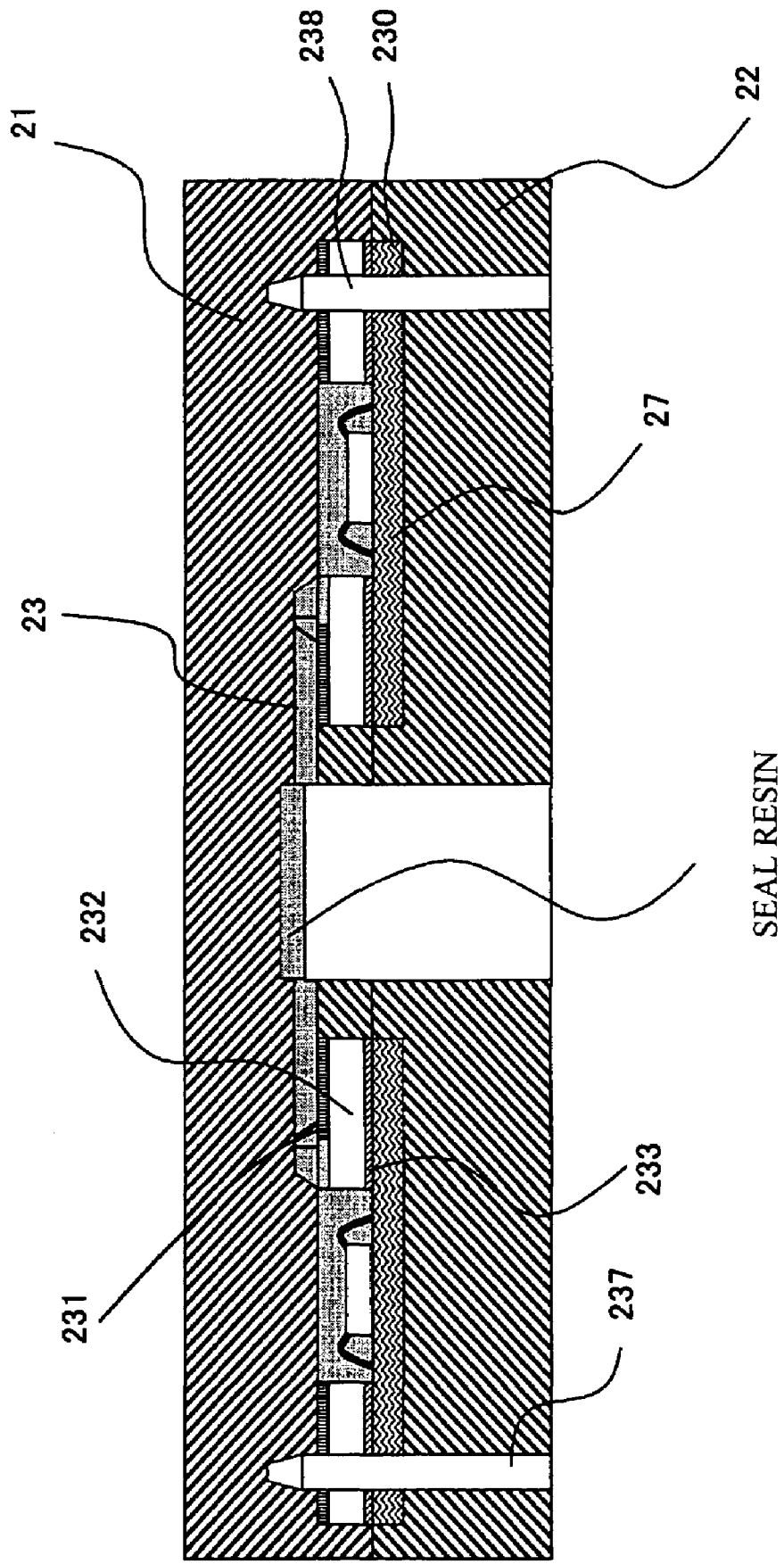
FIG. 9 illustrates an exemplary arrangement in which the plate is fixed to upper and lower modes by guide pins in accordance with embodiments of the present invention.

FIG. 9 shows an example in accordance with the third embodiment of the present invention in which the plate 230 is fixed to the upper mold 21 and the lower mold 22 by guide pins 237 and 238, which are the positioning pins. The plate 230 is made up of multiple thin plates, each of which has guide holes 236 through which the guide pins 237 and 238 are inserted. The multiple thin plates can be positioned to the upper mold 21 and the lower mold 22 by using the guide pins 237 and 238, without fixing these thin plates by adhesion or the like, while the seal resin 240 is applied through the gates 235 and the cavities 234.

Fourth Embodiment

Figure 10:
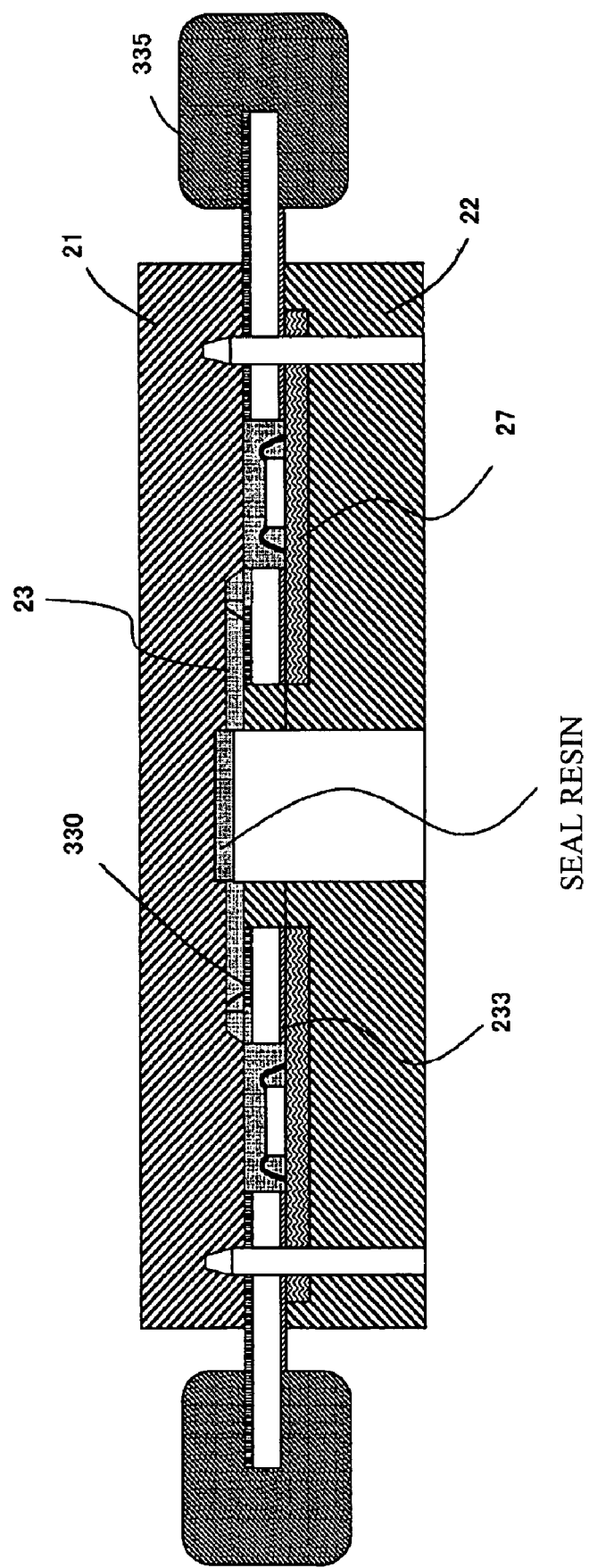
FIG. 10 illustrates an exemplary arrangement in which an outer frame is provided to the plate in accordance with embodiments of the present invention.

A fourth embodiment of the present invention will now be described. FIG. 10 shows an exemplary structure in accordance with the fourth embodiment of the present invention in which an outer frame is attached to the plate. FIG. 11A is a plan view of a plate 330 in accordance with the fourth embodiment of the present invention, FIG. 11B is a cross-sectional view taken along a line A-A shown in FIG. 11A, and FIG. 11C is a cross-sectional view taken along a line B-B shown therein.

Recently, semiconductor packages have become thinner and a thinner plate is required. As the plate becomes thinner, the rigidity of the plate is degraded and deformed during use. Taking the above into consideration, an outer frame 335 is attached to the plate 330 along the circumference thereof. The outer frame 335 makes it possible to use a plate having a small rigidity and thin seal resin. As shown in FIGS. 11A to 11C, the plate 330 is provided multiple supply ports 331a and 331b for supplying melted seal resin 240 from the lower mold 22. Cavities 332a, 332b, 333a and 333b are symmetrically arranged across the multiple supply ports 331a and 331b. Gates 334 are provided in positions that allow the seal resin 240 to be injected from sides of the cavities 332a, 332b, 333a and 333b. Further, portions of the plate 330 that contact the seal resin 240 are coated with fluorocarbon resin or plated with gold for ease of removal of the resin.

In accordance with the manufacturing method for semiconductor devices described above, it is possible to eliminate contamination of the electrode pads caused by oil or particles such as resin burrs. It is also possible to prevent occurrence of resin burrs on the upper surface of the molded body and improve production yield.

The present invention is not limited to the specifically described embodiments, but includes various variations and modifications within the scope of the present invention as defined by the claims below and their equivalents.

What is claimed is:

1. An apparatus for manufacturing a semiconductor device comprising:
   an upper mold;
   a lower mold having a supply port formed therein for providing resin therethrough; and
   a plate being interposed between the upper mold and the lower mold and including at least one cavity that receives the resin and defines an outer shape and a thickness of a resin sealing portion and a gate coupling to the supply port through a runner formed in either the upper mold or the lower mold, the resin being guided to the cavity to which the gate is connected through the runner and the gate, wherein the plate comprises a resin film provided on a side thereof that contacts a substrate of the semiconductor device.

2. The apparatus as claimed in claim 1, wherein the plate is fixed to the side thereof that contacts the substrate of the semiconductor device by viscoelastic or adhesive bonding.

3. The apparatus as claimed in claim 1, wherein the plate and the resin film have a through hole into which a given pin is inserted.

4. The apparatus as claimed in claim 1, wherein the plate comprises multiple thin plates that are laminated.

5. The apparatus as claimed in claim 4, wherein the multiple thin plates are laminated and bonded by welding.

6. An apparatus for manufacturing a semiconductor device comprising:
   an upper mold;
   a lower mold; and
   a plate that includes at least one cavity that receives resin and defines an outer shape and a thickness of a resin sealing portion, and a gate through which the resin is guided to the cavity to which the gate is connected, the plate being interposed between the upper mold and the lower mold, wherein the plate comprises multiple thin plates that are laminated, and the gate is provided in an uppermost one of the multiple thin plates.

7. The apparatus as claimed in claim 6, wherein the multiple thin plates have through holes that are provided in corresponding positions, a given pin being inserted into the through holes.

8. The apparatus as claimed in claim 6, wherein the plate is fixed to the upper and lower molds by a positioning pin.

9. The apparatus as claimed in claim 6, wherein the plate has a portion that contacts the resin, said portion being coated with fluorocarbon resin or being plated with gold.

10. A method of fabricating a semiconductor device comprising:
    placing a plate between an upper mold and a lower mold, wherein the plate comprises multiple thin plates that are laminated, the plate including at least one cavity that receives resin and defines an outer shape and a thickness of a resin sealing portion and a gate through which the resin is guided to the cavity to which the gate is connected, the resin guided to the cavity to which the gate is connected from an output of a runner formed in either in the upper mold or the lower mold, a substrate of the semiconductor device being provided on the plate; and
    supplying resin from a supply port provided in the lower mold to the runner and thence to the cavity via the gate connected to the cavity, coupled to the runner and provided in the plate to form the resin sealing portion over the substrate.

11. The apparatus as claimed in claim 4, wherein the multiple thin plates have through holes that are provided in corresponding positions, a given pin being inserted into the through holes.

12. The apparatus as claimed in claim 6, wherein the cavity has an opening area that varies in a thickness direction of the plate.

13. The apparatus as claimed in claim 6, wherein the gate has an opening area that varies in a thickness direction thereof.

14. The apparatus as claimed in claim 6, wherein the gate is provided at a position at which the resin is supplied from a side of the cavity.

15. The apparatus as claimed in claim 6, wherein the plate comprises a resin film provided on a side thereof that contacts a substrate of the semiconductor device.

16. The apparatus as claimed in claim 15, wherein the plate is fixed to the side thereof that contacts the substrate of the semiconductor device by viscoelastic or adhesive bonding.

17. The apparatus as claimed in claim 6, wherein the multiple thin plates are laminated and bonded by welding.

* * * * *